United States Patent
Sekiya et al.

(10) Patent No.: US 7,521,337 B2
(45) Date of Patent: Apr. 21, 2009

(54) WAFER LASER PROCESSING METHOD

(75) Inventors: Kazuma Sekiya, Tokyo (JP); Koichi Shigematsu, Tokyo (JP)

(73) Assignee: Disco Corporation, Tokyo (JP)

( * ) Notice: Subject to any disclaimer, the term of this patent is extended or adjusted under 35 U.S.C. 154(b) by 110 days.

(21) Appl. No.: 11/819,952

(22) Filed: Jun. 29, 2007

(65) Prior Publication Data
US 2008/0007737 A1    Jan. 10, 2008

(30) Foreign Application Priority Data
Jul. 5, 2006    (JP) .............................. 2006-185085

(51) Int. Cl.
*H01L 21/00* (2006.01)
(52) U.S. Cl. ..................... 438/463; 438/460; 438/462; 257/E21.211; 257/E21.596
(58) Field of Classification Search ................... 438/42; 257/E21.482, E21.483
See application file for complete search history.

(56) References Cited

U.S. PATENT DOCUMENTS 7,459,655 B2 * 12/2008 Nomaru ................. 219/121.78

2005/0224475 A1    10/2005 Nomaru
2007/0141811 A1 *  6/2007 Sekiya et al. ............... 438/463
2007/0164073 A1 *  7/2007 Watanabe et al. .......... 225/96.5

FOREIGN PATENT DOCUMENTS

JP            3408805         3/2003
JP        2005-297012        10/2005

* cited by examiner

*Primary Examiner*—Walter L Lindsay, Jr.
*Assistant Examiner*—Cheung Lee
(74) *Attorney, Agent, or Firm*—Smith, Gambrell & Russell, LLP

(57) ABSTRACT

A wafer laser processing method for forming a deteriorated layer along streets in the inside of a wafer having streets formed in a lattice pattern on the front surface, the method comprising: an undulation area deteriorated layer forming step for applying a laser beam along the streets to the undulating area of the wafer without activating the focal point position adjustment means to form a deteriorated layer along the streets in the inside of the undulating area of the wafer; and a stable holding area deteriorated layer forming step for applying a laser beam along the streets to a stable holding area other than the undulation area of the wafer while the focal point position adjustment means is controlled based on a detection signal from the height position detection means to form a deteriorated layer along the streets in the inside of the stable holding area of the wafer.

2 Claims, 9 Drawing Sheets (a)  (b)

(a)

(b)

(a)

(b)

(c)

(d)

WAFER LASER PROCESSING METHOD

FIELD OF THE INVENTION

The present invention relates to a wafer laser processing method comprising applying a laser beam along streets formed on the front surface of a wafer suction-held on a chuck table to form a deteriorated layer along the streets in the inside of the wafer.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC or LSI is formed in each of the sectioned areas. Individual semiconductor chips are manufactured by cutting this semiconductor wafer along the dividing lines to divide it into the areas each having a circuit formed thereon. An optical device wafer having a gallium nitride-based compound semiconductor laminated on the surface of a sapphire substrate is also cut along dividing lines to be divided into individual optical devices such as photodiodes or laser diodes which are widely used in electric appliances.

As a means of dividing a plate-like workpiece such as a semiconductor wafer, a laser processing method for applying a pulse laser beam having permeability for the workpiece with its focal point set to the inside of the area to be divided is also attempted nowadays and disclosed by Japanese Patent No. 3408805. In the dividing method making use of this laser processing technique, the workpiece is divided by applying a pulse laser beam of a wavelength (for example, 1,064 nm) having permeability for the workpiece to one side of the workpiece with its focal point set to the inside to continuously form a deteriorated layer along the dividing lines in the inside of the workpiece and exerting external force along the dividing lines whose strength has been reduced by the formation of the deteriorated layers.

When the plate-like workpiece such as a semiconductor wafer has undulation and is not uniform in thickness, the deteriorated layers cannot be formed at a predetermined depth uniformly by applying a laser beam due to its refractive index. Therefore, to form deteriorated layers at a predetermined depth uniformly in the inside of the semiconductor wafer, the unevenness of the area to which a laser beam is to be applied must be detected in advance, and a laser beam application means must follow this unevenness to carry out processing.

To solve the above problem, JP-A 2005-297012 proposes a laser beam processing machine which comprises a laser beam application means having a condenser for applying a laser beam to a workpiece held on a chuck table to form its focal point, a focal point position adjustment means for moving the focal point formed by the condenser in a direction perpendicular to the workpiece holding surface, a height position detection means for detecting the height position of the laser beam application area of the workpiece held on the chuck table, and a control means for controlling the focal point position adjustment means based on a height position signal detected by the height position detection means.

When the wafer is suction-held on the chuck table of the laser beam processing machine, the outer peripheral portion of the wafer warps with the result of large undulation. When this undulation becomes larger than a predetermine value (for example, 30 µm), it is difficult to control the focal point position adjustment means properly.

SUMMARY OF THE INVENTION

It is an object of the present invention to provide a wafer laser processing method capable of forming a deteriorated layer at a desired position in the inside of a wafer in response to variations in the thickness of the wafer even when the outer peripheral portion of the wafer suction-held on a chuck table warps.

To attain the above object, according to the present invention, there is provided a wafer laser processing method for forming a deteriorated layer in the inside of a wafer having streets formed in a lattice pattern on the front surface along the streets by using a laser beam processing machine comprising a chuck table having a holding surface for suction-holding the wafer, a laser beam application means having a condenser for applying a laser beam to the wafer suction-held on the holding surface of the chuck table, a focal point positioning means for moving the condenser of the laser beam application means in a direction perpendicular to the holding surface, a focal point position adjustment means for shifting the position of the focal point of a laser beam applied from the condenser of the laser beam application means, a height position detection means for detecting the height position of the top surface of the wafer held on the chuck table, and a control means for controlling the focal point position adjustment means based on a detection signal from the height position detection means, the method comprising:

a wafer holding step for suction-holding the wafer on the chuck table in such a manner that the processing surface (i.e., surface to be processed) of the wafer faces up;

an undulating area detection step for detecting an undulating area in the outer peripheral portion of the wafer suction-held on the chuck table by means of the height position detection means;

an undulating area deteriorated layer forming step for activating the focal point positioning means to position the focal point of the laser beam applied from the condenser of the laser beam application means to a preset position and applying a laser beam along the streets to the undulating area of the wafer suction-held on the chuck table without activating the focal point position adjustment means to form a deteriorated layer along the streets in the inside of the undulating area of the wafer; and a stable holding area deteriorated layer forming step for applying a laser beam along the streets to a stable holding area other than the undulating area of the wafer suction-held on the chuck table while the focal point position adjustment means is controlled based on a detection signal from the height position detection means, to form a deteriorated layer along the streets in the inside of the stable holding area of the wafer.

The undulating area detection step is carried out while the chuck table suction-holding the wafer is turned.

Since the processing pulse laser beam is applied to the undulating area of the wafer suction-held on the chuck table without activating the focal point position adjustment means in the wafer laser processing method of the present invention, even if the amount of undulation is large, the control means is free from getting out of control and the desired deteriorated layer can be formed in the inside of the wafer. Further, since the processing pulse laser beam is applied to the stable holding area by activating the focal point position adjustment means while the focal point of the processing pulse laser beam is adjusted in accordance with the height position of the wafer, laser processing can be carried out at a position parallel to the processing surface of the wafer.

DETAILED DESCRIPTION OF THE PREFERRED EMBODIMENTS

Preferred embodiments of the present invention will be described in more detail with reference to the accompanying drawings.

Figure 1:
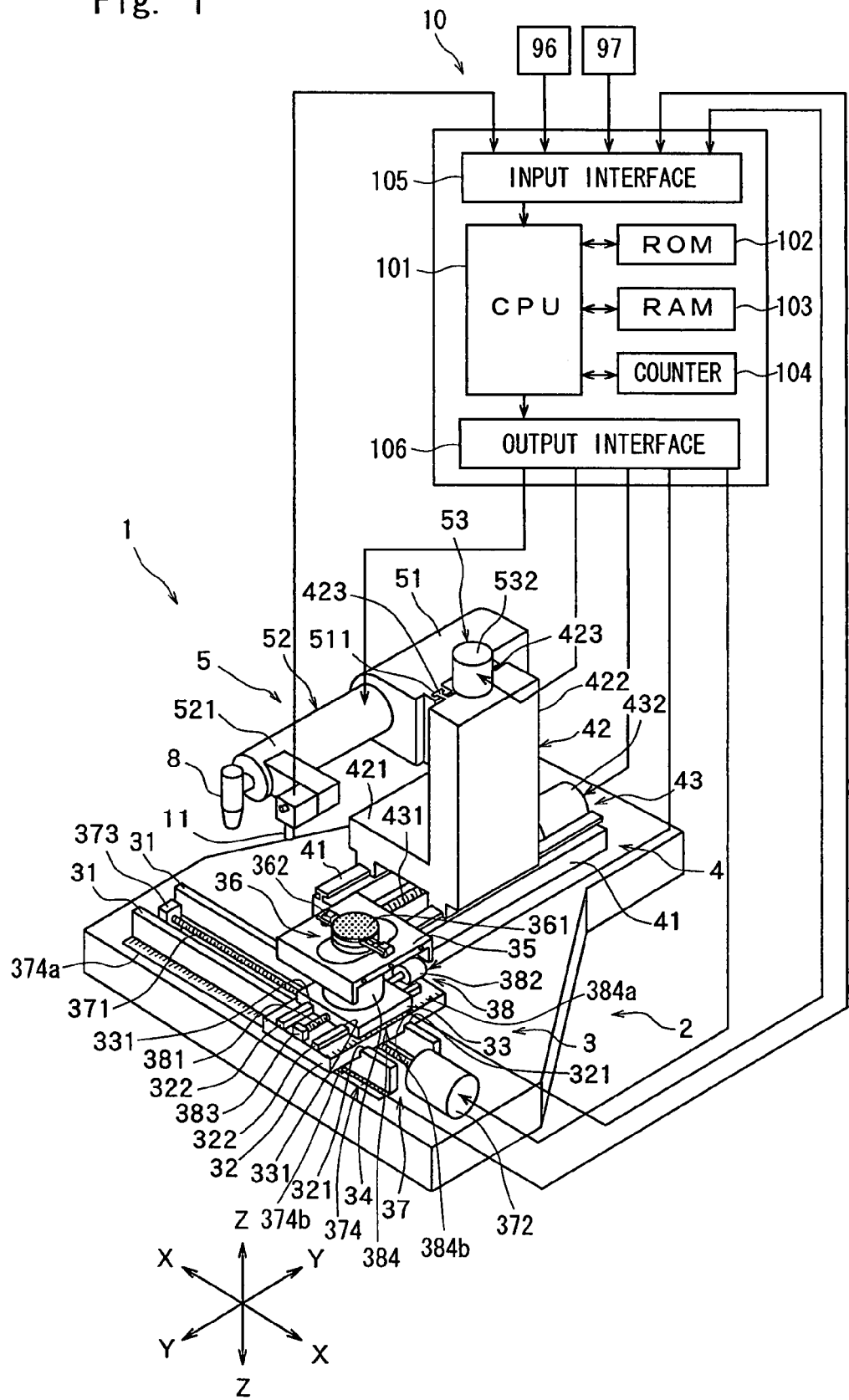
FIG. 1 is a perspective view of an example of a laser beam processing machine for carrying out the wafer laser processing method of the present invention.

FIG. 1 is a perspective view of a laser beam processing machine for carrying out the wafer laser processing method of the present invention. The laser beam processing machine 1 shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 mounted on the stationary base 2 in such a manner that it can move in an indexing-feed direction indicated by an arrow Y perpendicular to the direction indicated by the arrow X, and a laser beam application unit 5 mounted to the laser beam application unit support mechanism 4 in such a manner that it can move in a direction indicated by an arrow Z.

The above chuck table mechanism 3 comprises a pair of guide rails 31 and 31 mounted on the stationary base 2 and arranged parallel to each other in the processing-feed direction indicated by the arrow X, a first sliding block 32 mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a support table 35 supported on the second sliding block 33 by a cylindrical member 34, and a chuck table 36 as a workpiece holding means. This chuck table 36 comprises an adsorption chuck 361 made of a porous material, and a workpiece, for example, a disk-like semiconductor wafer is held on a holding surface which is the top surface of the adsorption chuck 361 by a suction means that is not shown. The chuck table 36 constituted as described above is turned by a pulse motor (not shown) installed in the cylindrical member 34. The chuck table 36 is provided with clamps 362 for fixing an annular frame which will be described later.

The above first sliding block 32 has, on the undersurface, a pair of to-be-guided grooves 321 and 321 to be fitted to the above pair of guide rails 31 and 31 and, on the top surface, a pair of guide rails 322 and 322 formed parallel to each other in the indexing-feed direction indicated by the arrow Y. The first sliding block 32 constituted as described above can move along the pair of guide rails 31 and 31 in the processing-feed direction indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction indicated by the arrow X. The processing-feed means 37 comprises a male screw rod 371 arranged between the above pair of guide rails 31 and 31 in parallel thereto, and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The laser beam processing machine 1 in the illustrated embodiment comprises a processing-feed amount detection means 374 for detecting the processing-feed amount of the above chuck table 36. The processing-feed amount detection means 374 comprises a linear scale 374a arranged along the guide rail 31 and a read head 374b which is mounted on the first sliding block 32 and moves along the linear scale 374a together with the first sliding block 32. The read head 374b of this processing-feed amount detection means 374 supplies one pulse signal for every 1 μm to a control means which will be described later in the illustrated embodiment. The control means counts the input pulse signals to detect the processing-feed amount of the chuck table 36. When the pulse motor 372 is used as a drive source for the above processing-feed means 37, the processing-feed amount of the chuck table 36 can be detected by counting the drive pulses of the control means for outputting a drive signal to the pulse motor 372. When a servo motor is used as a drive source for the above processing-feed means 37, the processing-feed amount of the chuck table 36 can be detected by counting pulse signals input into the later-described control means from a rotary encoder for detecting the revolution of the servo motor.

The above second sliding block 33 has, on the undersurface, a pair of to-be-guided grooves 331 and 331 to be fitted to the pair of guide rails 322 and 322 on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 along the pair of guide rails 322 and 322 provided on the first sliding block 32 in the indexing-feed direction indicated by the arrow Y. The first indexing-feed means 38 comprises a male screw rod 381 which is arranged between the above pair of guide rails 322 and 322 in parallel thereto and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The laser beam processing machine 1 in the illustrated embodiment comprises an index-feed amount detection means 384 for detecting the index-feed amount of the above second sliding block 33. This index-feed amount detection means 384 comprises a linear scale 384a arranged along the guide rail 322 and a read head 384b which is mounted on the second sliding block 33 and moves along the linear scale 384a together with the second sliding block 33. The read head 384b of the index-feed amount detection means 384 supplies one pulse signal for every 1 μm to the later-described control means in the illustrated embodiment. The control means later-described counts the input pulse signals to detect the index-feed amount of the chuck table 36. When the pulse motor 382 is used as a drive source for the above first indexing-feed means 38, the index-feed amount of the chuck table 36 can be detected by counting the drive pulses of the later-described control means for outputting a drive signal to the pulse motor 382. When a servo motor is used as a drive source for the above first indexing-feed means 38, the index-feed amount of the chuck table 36 can be detected by counting pulse signals input into the later-described control means from a rotary encoder for detecting the revolution of the servo motor.

The above laser beam application unit support mechanism 4 comprises a pair of guide rails 41 and 41 which are mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment comprises a second indexing-feed means 43 for moving the movable support base 42 along the pair of guide rails 41 and 41 in the indexing-feed direction indicated by the arrow Y. This second indexing-feed means 43 comprises a male screw rod 431 arranged between the above pair of guide rails 41 and 41 in parallel thereto, and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 provided on the above mounting portion 422 and is supported in such a manner that it can move in the direction indicated by the arrow Z by fitting the to-be-guided grooves 511 and 511 to the above guide rails 423 and 423, respectively.

Figure 2:
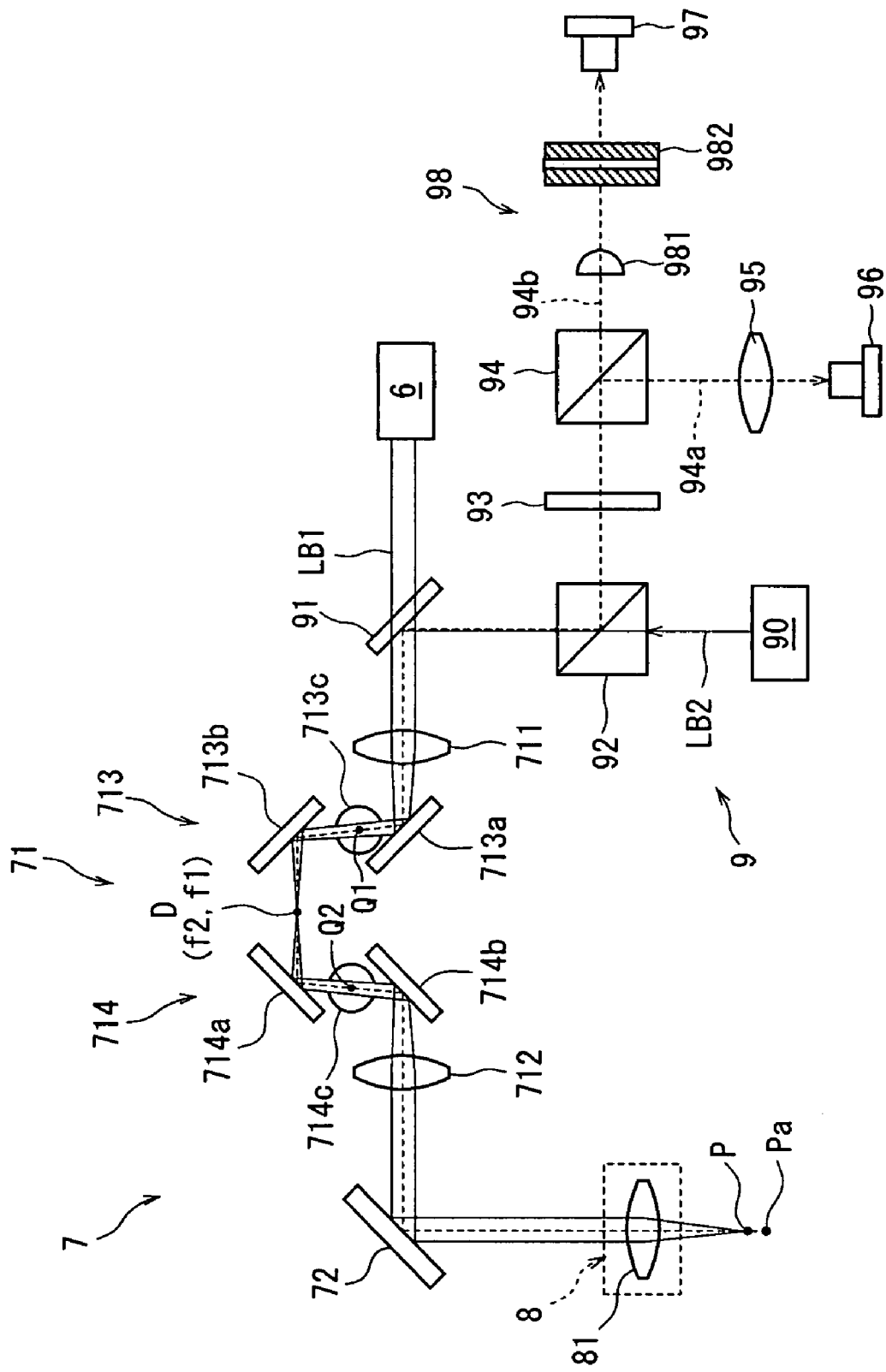
FIG. 2 is a block diagram showing the constitution of a laser beam application means provided in the laser beam processing machine shown in FIG. 1.

The illustrated laser beam application means 52 comprises a cylindrical casing 521 extending substantially horizontally. In the casing 521, there are installed a processing pulse laser beam oscillation means 6 and an optical transmission means 7 for transmitting a processing pulse laser beam oscillated by this processing pulse laser beam oscillation means 6 as shown in FIG. 2. A condenser 8 comprising a condenser lens 81 for converging a laser beam transmitted by the optical transmission means 7 is mounted on the end of the casing 521 (see FIG. 1). The processing pulse laser beam oscillation means 6 oscillates a processing pulse laser beam LB1 of a wavelength having permeability for a wafer as the workpiece. As this processing pulse laser beam oscillation means 6 may be used a YVO4 pulse laser oscillator or a YAG pulse laser oscillator for oscillating a processing pulse laser beam LB1 having a wavelength of 1,064 nm in the cases where the wafer comprises a silicon substrate, silicon carbide substrate, lithium tantalate substrate, glass substrate or quartz substrate.

The optical transmission means 7 comprises a focal point position adjustment means 71 for shifting the position of the focal point of the processing pulse laser beam LB1 that is oscillated from the processing pulse laser beam oscillation means 6 and is focused by the condenser lens 81 and a direction changing mirror 72 for changing the direction of the processing pulse laser beam LB1 transmitted through the focal point position adjustment means 71 to a downward direction at 90° in FIG. 2. The focal point position adjustment means 71 comprises a first convex lens 711 and a second convex lens 712 which are spaced apart from each other, and a first galvanoscanner 713 for reflecting and deflecting a laser beam passing through the first convex lens 711 and a second galvanoscanner 714 for reflecting and deflecting the laser beam reflected and deflected by the first galvanoscanner 713, which are interposed between the first convex lens 711 and the second convex lens 712.

Figure 3:
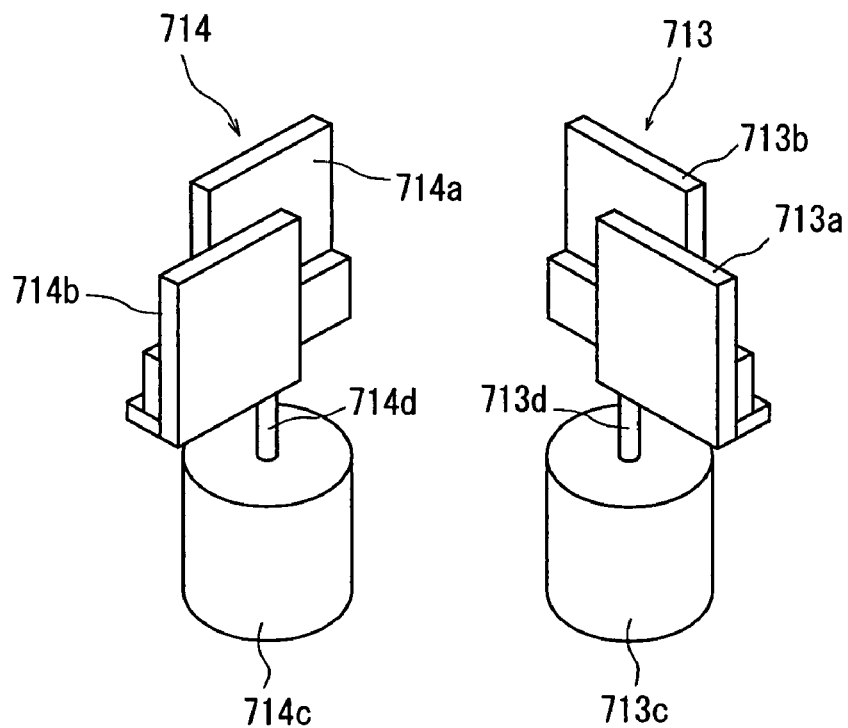
FIG. 3 is a perspective view of a first galvanoscanner and a second galvanoscanner constituting a height position detection means shown in FIG. 2.

As shown in FIG. 3, the first galvanoscanner 713 comprises a pair of first mirror 713a and second mirror 713b which are arranged parallel to each other at a predetermined interval with their reflective surfaces opposed to each other, and an angle adjusting actuator 713c for adjusting the installation angles of the first mirror 713a and the second mirror 713b. As shown in FIG. 2, the first mirror 713a of the first galvanoscanner 713 constituted as described above reflects and deflects a laser beam passing through the first convex lens 711 toward the second mirror 713b, and the second mirror 713b reflects and deflects the laser beam reflected and deflected by the first mirror 713a toward the second galvanoscanner 714. The turning shaft 713d of the angle adjusting actuator 713c is transmission-connected to a connection portion between the pair of first mirror 713a and second mirror 713b. The angle adjusting actuator 713c is controlled by a control means which will be described later to change the installation angles of the pair of first mirror 713a and second mirror 713b.

The second galvanoscanner 714 is opposed to the above first galvanoscanner 713 and comprises a pair of first mirror 714a and second mirror 714b which are arranged parallel to each other at a predetermined interval with their reflective surfaces opposed to each other, and an angle adjusting actuator 714c for adjusting the installation angles of the first mirror 714a and the second mirror 714b. As shown in FIG. 2, the first mirror 714a of the second galvanoscanner 714 constituted as described above reflects and deflects the laser beam reflected and deflected by the second mirror 713b of the first galvanoscanner 713 toward the second mirror 714b, and the second mirror 714b reflects and deflects the laser beam reflected and deflected by the first mirror 714a toward the above direction changing mirror 72. The turning shaft 714d of the angle adjusting actuator 714c is transmission-connected to a connection portion between the pair of first mirror 714a and second mirror 714b. The angle adjusting actuator 714c is controlled by the control means which will be described later to change the installation angles of the pair of first mirror 714a and second mirror 714b.

The above focal point position adjustment means 71 is constituted such that the focal point (f1) of the first convex lens 711 and the focal point (f2) of the second convex lens 712 are converged at a focusing point D between the second mirror 713b of the first galvanoscaner 713 and the first mirror 714a of the second galvanoscanner 714 in the state shown in FIG. 2. In this state, the pulse laser beam emitted toward the direction changing mirror 72 from the second convex lens 712 becomes parallel. The first mirror 713a and the second mirror 713b of the first galvanoscanner 713 and the first mirror 714a and the second mirror 714b of the second galvanoscanner 714 can be turned on points Q1 and Q2 about which they are symmetrical, as the centers thereof, respectively.

In the focal point position adjustment means 71 constituted as described above, the processing pulse laser beam LB1 oscillated from the processing pulse laser beam oscillation means 6 is guided to the direction changing mirror 72 through the first convex lens 711, the first mirror 713a and the second mirror 713b of the first galvanoscanner 713, the first mirror 714a and the second mirror 714b of the second galvanoscanner 714, and the second convex lens 712. And, the pair of first mirror 713a and second mirror 713b and the pair of first mirror 714a and second mirror 714b are turned on the points Q1 and Q2 as the centers thereof by the angle adjusting actuator 713c of the first galvanoscanner 713 and the angle adjusting actuator 714c of the second galvanoscanner 714, respectively, to change the installation angles of the mirrors, thereby making it possible to shift the focal point (f1) of the first convex lens 711 and the focal point (f2) of the second convex lens 712 in the horizontal direction in FIG. 2.

In the focal point position adjustment means 71 constituted as described above, the focal point (f1) of the first convex lens 711 and the focal point (f2) of the second convex lens 712 are both existent at the focusing point D as described above, and the processing pulse laser beam LB1 transmitted from the second convex lens 712 toward the direction changing mirror 72 becomes parallel in the state shown in FIG. 2. In this case, the focal point P formed by the condenser lens 81 is existent at the position shown in FIG. 2. Meanwhile, when the focal point (f1) of the first convex lens 711 is shifted to the left side in FIG. 2 of the above focusing point D and the focal point (f2) of the second convex lens 712 is shifted to the right side in FIG. 2 of the above focusing point D by turning the first mirror 713a and the second mirror 713b of the first galvanoscanner 713 and the first mirror 714a and the second mirror 714b of the second galvanoscanner 714 in one direction on the points Q1 and Q2 as the centers thereof, the processing pulse laser beam LB1 emitted from the second convex lens 712 toward the direction changing mirror 72 becomes widened toward the end. As a result, the processing pulse laser beam LB1 entering the condenser lens 81 through the direction changing mirror 72 also widens toward the end, whereby the focal point P formed by the condenser lens 81 shifts from the position shown in FIG. 2 in the downward direction. On the other hand, when the focal point (f1) of the first convex lens 711 is shifted to the right side in FIG. 2 of the above focusing point D and the focal point (f2) of the second convex lens 712 is shifted to the left side in FIG. 2 of the above focusing point D by turning the first mirror 713a and the second mirror 713b of the first galvanoscanner 713 and the first mirror 714a and the second mirror 714b of the second galvanoscanner 714 in the other direction on the points Q1 and Q2 as the centers thereof, the processing pulse laser beam LB1 applied from the second convex lens 712 toward the direction changing mirror 72 tapers. As a result, the processing pulse laser beam LB1 applied to the above condenser lens 81 through the direction changing mirror 72 also tapers, whereby the focal point P formed by the condenser lens 81 shifts from the position shown in FIG. 2 in the upward direction.

The condenser 8 having the above condenser lens 81 is mounted on the end portion of the above casing 521. This condenser 8 is constituted by a combination of lenses including the condenser lens 81 and focuses the processing pulse laser beam LB1 which is oscillated by the above processing pulse laser beam oscillation means 6 and transmitted through the focal point position adjustment means 71 and the direction changing mirror 72 at the focal point P.

Still referring to FIG. 2, the laser beam processing machine 1 in the illustrated embodiment comprises a height position detection means 9 for detecting the height position of the top surface of the workpiece held on the chuck table. The height position detection means 9 comprises a detection laser beam oscillation means 90 for oscillating a detection laser beam, a dichroic half mirror 91, interposed between the above processing pulse laser beam oscillation means 6 and the focal point position adjustment means 71, for reflecting and deflecting a detection laser beam oscillated from the detection laser beam oscillation means 90 toward the focal point position adjustment means 71, and a first cubic splitter 92 interposed between the dichroic half mirror 91 and the detection laser beam oscillation means 90. The detection laser beam oscillation means 90 oscillates a laser beam having a frequency different from that of the processing pulse laser beam oscillated from the above processing pulse laser beam oscillation means 6. As this detection laser beam oscillation means 90 may be used a He—Ne pulse laser oscillator which oscillates a detection laser beam LB2 having a wavelength of, for example, 632 nm. The dichroic half mirror 91 transmits the processing pulse laser beam LB1 but reflects and deflects the detection laser beam LB2 toward the focal point position adjustment means 71. The first cubic splitter 92 transmits the detection pulse laser beam LB2 but reflects and deflects light reflected and deflected by the dichroic half mirror 91.

The height position detection means 9 in the illustrated embodiment comprises a bandpass filter 93 which transmits only reflected light corresponding to the frequency of the detection laser beam LB2 out of light reflected by the first cubic splitter 92, a second cubic splitter 94 for dividing the reflected light passing through the bandpass filter 93 into a first route 94*a* and a second route 94*b*, a condenser lens 95 for converging 100% of the reflected light split into the first route 94*a* by the second cubic splitter 94, and a first light receiving device 96 for receiving the reflected light converged by the condenser lens 95. The first light receiving device 96 supplies a voltage signal corresponding to the quantity of received light to the control means which will be described later. The height position detection means 9 in the illustrated embodiment comprises a second light receiving device 97 for receiving the reflected light split into the second route 94*b* by the second cubic splitter 94, and a light receiving area restricting means 98 for restricting the receiving area of the reflected light received by the second light receiving device 97. The light receiving area restricting means 98 in the illustrated embodiment is composed of a cylindrical lens 981 for converging the reflected light split into the second route 94*b* by the second cubic splitter 94 one-dimensionally and a one-dimensional mask 982 for restricting the reflected light converged by the cylindrical lens 981 one-dimensionally to a unit length. The second light receiving device 97 for receiving the reflected light passing through the one-dimensional mask 982 supplies a voltage signal corresponding to the quantity of received light to the control means-which will be described later.

The height position detection means 9 in the illustrated embodiment is constituted as described above, and its function will be described hereinbelow.

The detection laser beam LB2 oscillated by the detection laser beam oscillation means 90 passes through the first cubic splitter 92 and reaches the dichroic half mirror 91 to be reflected and deflected by the dichroic half mirror 91 toward the focal point position adjustment means 71. The detection laser beam LB2 reflected and deflected toward the focal point position adjustment means 71 is converged by the condenser lens 81 through the focal point position adjustment means 71 and the direction changing mirror 72 like the above processing pulse laser beam LB1. As the detection laser beam LB2 oscillated from the detection laser beam oscillation means 90 is preferably used a laser beam having a wide spread angle whose focal point formed by the condenser lens 81 is positioned below the focal point P of the processing pulse laser beam LB1 oscillated from the above processing pulse laser beam oscillation means 6 in FIG. 2. The detection laser beam LB2 focused as described above is reflected on the top surface of the workpiece held on the chuck table 36, and this reflected light reaches the bandpass filter 93 through the condenser lens 81, the direction changing mirror 72, the focal point position adjustment means 71, the dichroic half mirror 91 and the first cubic splitter 92 as shown by the broken line in FIG. 2. The reflected light of the above processing pulse laser beam LB1 also reaches the bandpass filter 93 through the same route as that of the detection laser beam LB2. Since the bandpass filter 93 is constituted to transmit only reflected light corresponding to the frequency of the detection laser beam LB2 as described above, the reflected light of the processing pulse laser beam LB1 is cut off by the bandpass filter 93. Therefore, only the reflected light of the detection laser beam LB2 passes through the bandpass filter 93 and reaches the second cubic splitter 94.

The reflected light of the detection laser beam LB2 which has reached the second cubic splitter 94 is split into the first route 94*a* and the second route 94*b*. 100 Percent of the reflected light split into the first route 94*a* is converged by the condenser lens 95 and received by the first light receiving device 96. The first light receiving device 96 supplies a voltage signal corresponding to the quantity of received light to the control means which will be described later. Meanwhile, the reflected light of the detection laser beam LB2 split into the second route 94*b* is converged one-dimensionally by the cylindrical lens 981 of the light receiving area restricting means 98, restricted to the predetermined unit length by the one-dimensional mask 982 and received by the second light receiving device 97. The second light receiving device 97 supplies a voltage signal corresponding to the quantity of received light to the control means which will be described later.

A description is subsequently given of the quantity of the reflected light of the detection laser beam LB2 received by the first light receiving device 96 and the second light receiving device 97.

Since 100% of the reflected light of the detection laser beam LB2 received by the first light receiving device 96 is converged by the condenser lens 95, the quantity of received light is constant and a voltage value (V1) output from the first light receiving device 96 is constant (for example, 10 V). Meanwhile, since the reflected light of the detection laser beam LB2 received by the second light receiving device 97 is one-dimensionally converged by the cylindrical lens 981, restricted to the predetermined unit length by the one-dimensional mask 982 and received by the second light receiving device 97, the quantity of light received by the second light receiving device 97 changes according to the position of the focal point Pa of the detection laser beam LB2 converged by the condenser lens 81 of the condenser 8 in the workpiece. Therefore, the voltage value (V2) output from the second light receiving device 97 changes according to the position of the focal point Pa of the detection laser beam LB2 in the workpiece W.

Figure 4:
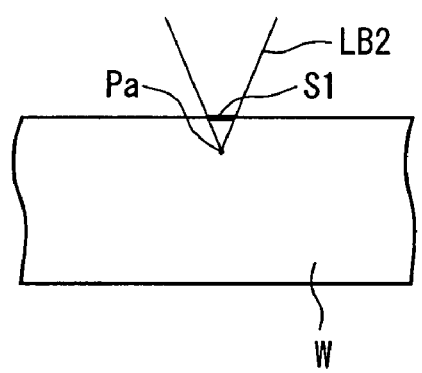
FIGS. 4(a) and 4(b) are explanatory diagrams showing a change in the position of the focal point of a detection laser beam applied from the height position detection means shown in FIG. 2.
Figure 4:
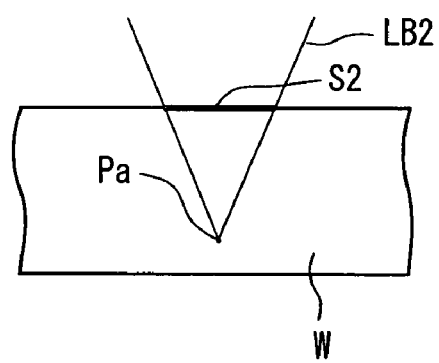

For instance, when the focal point Pa of the detection laser beam LB2 is existent at a shallow position from the surface of the workpiece was shown in FIG. 4(*a*), the detection laser beam LB2 is reflected on the application area S1 of the surface of the workpiece W. This reflected light is split into the first route 94*a* and the second route 94*b* by the second cubic splitter 94 as described above. Since 100% of the reflected light from the area S1 split into the first route 94*a* is converged by the condenser lens 95, the total quantity of the reflected light is received by the first light receiving device 96. Meanwhile, since the reflected light from the area S1 split into the second route 94*b* by the second cubic splitter 94 is one-dimensionally converged by the cylindrical lens 981, its section becomes elliptic. As the reflected light having an elliptic section is restricted to the predetermined unit length by the one-dimensional mask 98, part of the reflected light split into the second route 94*b* is received by the second light receiving device 97. Therefore, the quantity of the reflected light received by the second light receiving device 97 becomes smaller than the quantity of light received by the first light receiving device 96.

When the focal point Pa of the detection laser beam LB2 is deeper than the position shown in FIG. 4(a) as shown in FIG. 4(b), the detection laser beam LB2 is reflected on the application area S2 of the surface of the workpiece W. This area S2 is larger than the above area S1. The reflected light from the area S2 is split into the first route 94a and the second route 94b by the second cubic splitter 94 as described above. Since 100% of the reflected light from the area S2 split into the first route 94a is converged by the condenser lens 95, the total quantity of the reflected light is received by the first light receiving device 96. Meanwhile, since the reflected light from the area S2 split into the second route 94b by the second cubic splitter 94 is one-dimensionally converged by the cylindrical lens 981, its section becomes elliptic. The length of the long axis of this ellipse becomes larger than that shown in FIG. 4(a) as the area S2 of the reflected light is larger than the above area S1. The reflected light converged to have an elliptic section is restricted to the predetermined unit length by the one-dimensional mask 982, and part of the reflected light is received by the second light receiving device 97. Therefore, the quantity of light received by the second light receiving device 97 becomes smaller than that shown in FIG. 4(a). Thus, the quantity of reflected light received by the second light receiving device 97 becomes larger as the focal point Pa of the detection laser beam LB2 becomes closer to the surface of the workpiece W and smaller as the focal point Pa of the detection laser beam LB2 becomes farther from the surface of the workpiece W.

Preferably, the focal point Pa of the detection laser beam LB2 is always set so as to locate at the inside of the workpiece W. That is, even when the focal point Pa of the detection laser beam LB2 is set to locate at the inside of the workpiece W or above the surface of the workpiece W, if the distance from the surface of the workpiece W to the focal point Pa is the same, the quantity of light received by the second light receiving device 97 becomes the same. Therefore, the height position of the surface of the workpiece W can be detected without fail by setting the focal point Pa of the detection laser beam LB2 so as to locate at the inside of the workpiece W.

Figure 5:
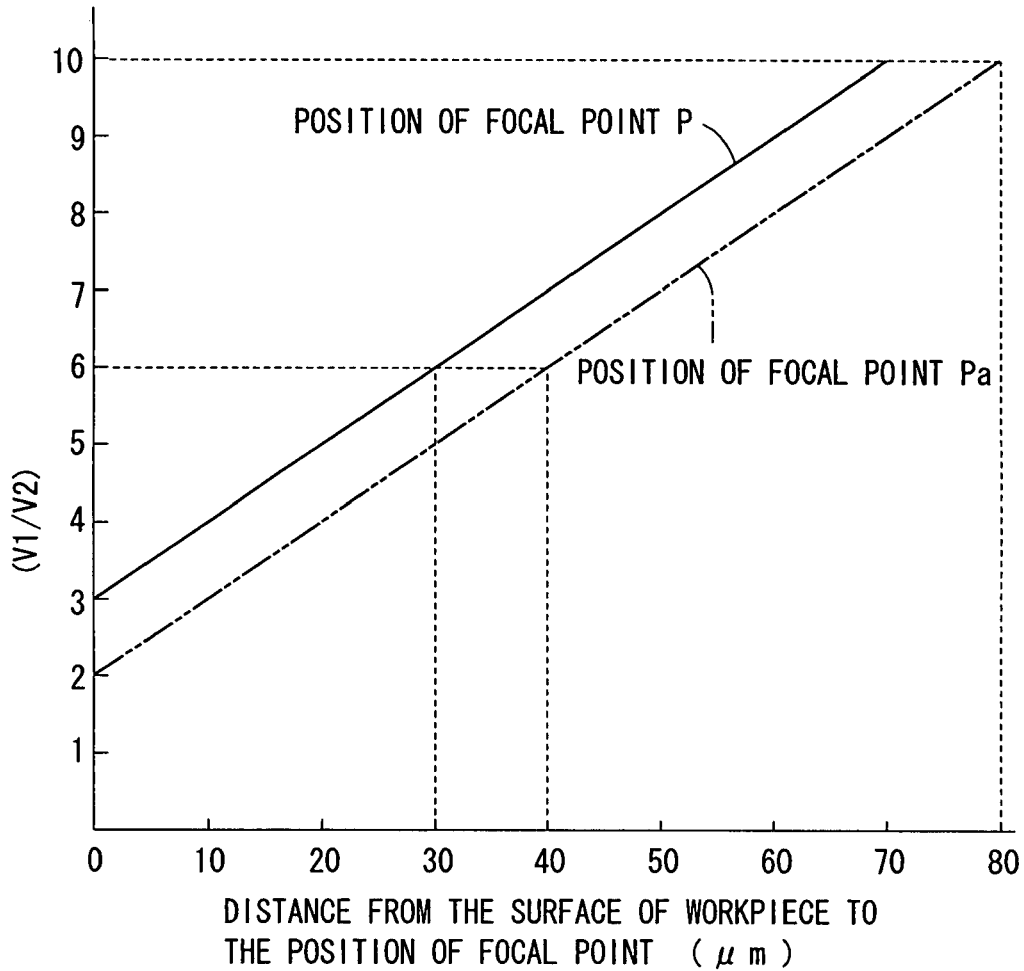
FIG. 5 is a control map showing the relationship between the ratio of a voltage value (V1) output from a first light receiving device to a voltage value (V2) output from a second light receiving device of the height position detection means shown in FIG. 2 and the position of the focal point of the detection laser beam in the workpiece.

The relationship between the ratio of the voltage value (V1) output from the above first light receiving device 96 to the voltage value (V2) output from the second light receiving device 97 and the position of the focal point Pa of the detection laser beam LB2 in the workpiece W will be described with reference to a control map shown in FIG. 5. In FIG. 5, the horizontal axis shows the position of the focal point Pa of the detection laser beam LB2, that is, the distance from the surface of the workpiece W to the focal point Pa in the inside of the workpiece W. The vertical axis in FIG. 5 shows the ratio (V1/V2) of the voltage value (V1) output from the first light receiving device 96 to the voltage value (V2) output from the second light receiving device 97.

In the example shown in FIG. 5, when the position of the focal point Pa of the detection laser beam LB2 is 10 µm away from the surface of the workpiece W, the above voltage value ratio (V1/V2) is "3" and when the position of the focal point Pa of the detection laser beam LB2 is 40 µm away from the surface of the workpiece W, the above voltage value ratio (V1/V2) is "6". When the position of the focal point Pa of the detection laser beam LB2 is set to, for example, a position 10 µm below the position of the focal point P of the processing pulse laser beam LB1 in FIG. 2, the above voltage value ratio (V1/V2) of the control map shown in FIG. 5 is a value obtained by compensating for the difference corresponding to the interval between the focal point P and the focal point Pa.

That is, since the focal point P of the processing pulse laser beam LB1 is positioned 10 µm above the focal point Pa of the detection laser beam LB2, a control map for the focal point P of the processing pulse laser beam LB1 is formed as shown by the solid line in FIG. 5. Therefore, even when the workpiece W is not uniform in thickness, laser processing can be made at a position 30 µm from the surface of the workpiece W by setting the above voltage value ratio (V1/V2) to "6" and controlling the above focal point position adjustment means 71 to maintain the above voltage value ratio (V1/V2) at "6". The control map shown in FIG. 5 is stored in the memory of the control means which will be described above.

Figure 6:
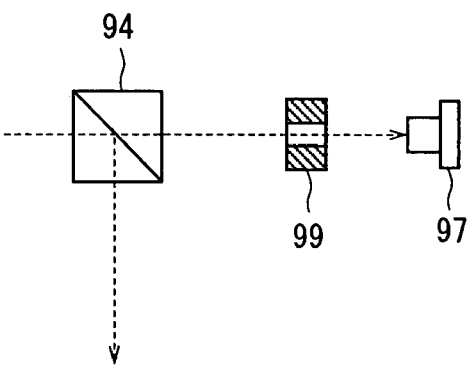
FIG. 6 is a block diagram of another example of a light receiving area restricting means constituting the height position detection means shown in FIG. 2.

In the above-mentioned height position detection means 9 shown in FIG. 2, the light receiving area restricting means 98 is composed of the cylindrical lens 981 and the one-dimensional mask 982. As the light receiving area restricting means 98 may be used a two-dimensional mask 99 for restricting the reflected light split into the second route 94b by the above second cubic splitter 94 to a unit area as shown in FIG. 6. When the two-dimensional mask 99 is used, the graph of the control map shown in FIG. 5 shows parabolas.

Returning to FIG. 1, an image pick-up means 11 for detecting the area to be processed by the laser beam application means 52 is mounted onto the end portion of the casing 521 constituting the above laser beam application means 52. This image pick-up means 11 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to the control means which will be described later.

The laser beam application unit 5 in the illustrated embodiment has a focal point positioning means 53 for moving the unit holder 51 along the pair of guide rails 423 and 423 in the direction indicated by the arrow Z (direction perpendicular to the holding surface which is the top surface of the adsorption chuck 361). The focal point positioning means 53 comprises a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the laser beam application means 52 comprising the condenser 8 are moved along the guide rails 423 and 423 in the direction indicated by the arrow Z. In the illustrated embodiment, the laser beam application means 52 is moved up by driving the pulse motor 532 in a normal direction and moved down by driving the pulse motor 532 in the reverse direction.

The laser beam processing machine 1 in the illustrated embodiment comprises the control means 10. The control means 10 is composed of a computer comprising a central processing unit (CPU) 101 for carrying out arithmetic processing based on a control program, a read-only memory (ROM) 102 for storing the control program, etc., a read/write random access memory (RAM) 103 for storing the results of arithmetic processing, a counter 104, an input interface 105 and an output interface 106. Detection signals from the above processing-feed amount detection means 374, index-feed amount detection means 384, first light receiving device 96, second light receiving device 97 and image pick-up means 11 are supplied to the input interface 105 of the control means 10.

Control signals are output to the above pulse motor 372, pulse motor 382, pulse motor 432, pulse motor 532, processing pulse laser beam oscillation means 6, detection laser beam oscillation means 90, angle adjusting actuator 713c of the first galvanoscanner 713 and angle adjusting actuator 714c of the second galvanoscanner 714 from the output interface 106 of the control means 10. The control map shown in FIG. 5 is stored in the read-only memory (ROM) 102 or the random access memory (RAM) 103.

The illustrated laser beam processing machine 1 is constituted as described above, and the wafer laser processing method which is carried out by using the laser beam processing machine 1 will be described hereinbelow.

Figure 7:
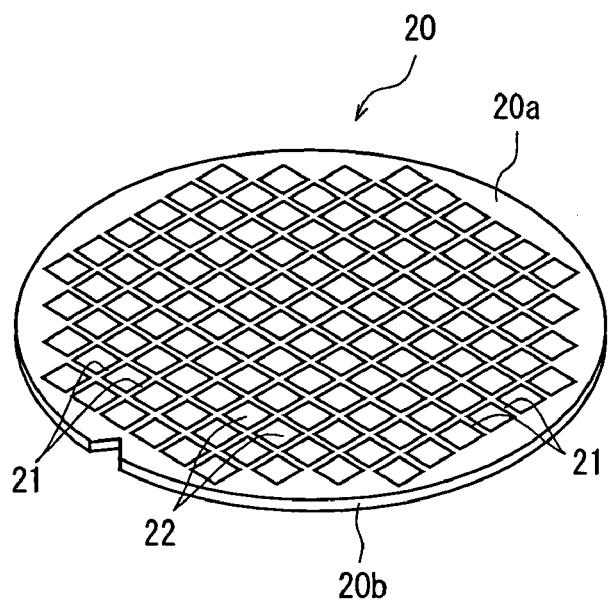
FIG. 7 is a perspective view of a semiconductor wafer as the workpiece.
Figure 8:
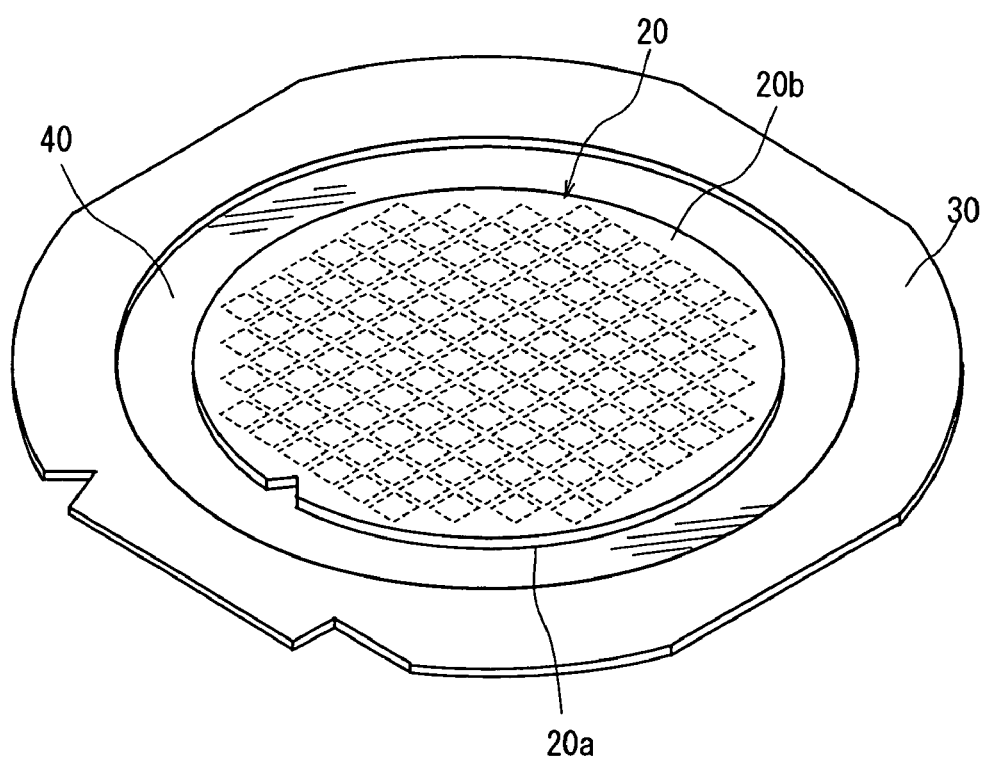
FIG. 8 is a perspective view showing a state where the semiconductor wafer shown in FIG. 7 is put on the surface of a protective tape mounted on an annular frame.

FIG. 7 is a perspective view of a semiconductor wafer 20 as the workpiece. The semiconductor wafer 20 shown in FIG. 7 is, for example, a silicon wafer having a thickness of 100 μm, and a device 22 such as IC or LSI is formed in a plurality of areas sectioned by a plurality of streets 21 formed in a lattice pattern on the front surface 20a. The front surface 20a of the semiconductor wafer 20 formed as described above is put on a protective tape 40 which is a synthetic resin sheet such as a polyolefin sheet, mounted on an annular frame 30, as shown in FIG. 8. Therefore, the rear surface 20b of the semiconductor wafer 20 faces up.

Figure 10:
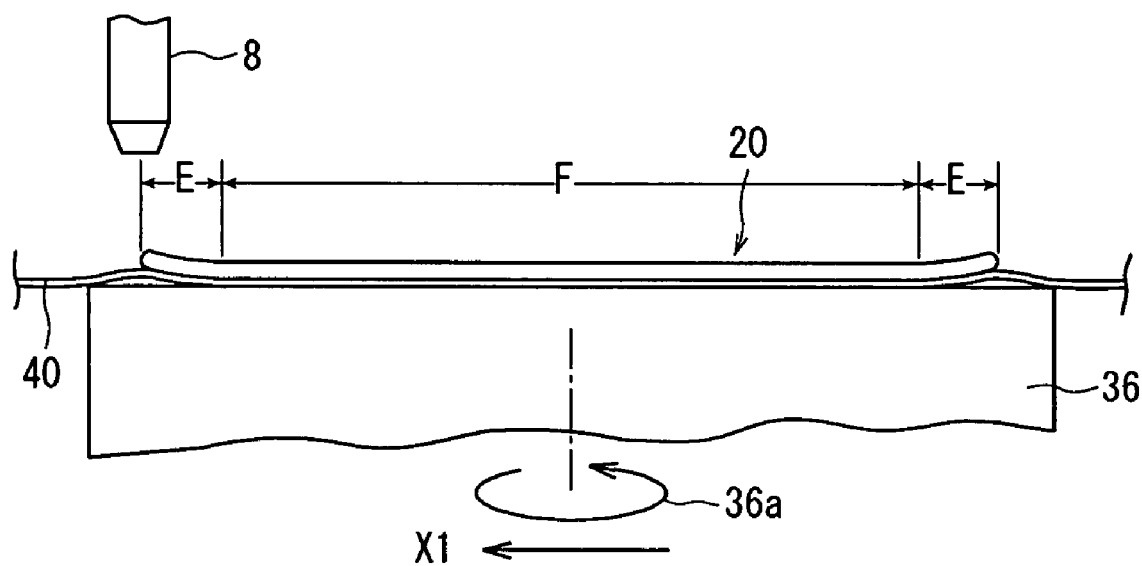
FIG. 10 is an explanatory diagram showing the undulating area detection step in the wafer laser processing method of the present invention.

The protective tape 40 side of the semiconductor wafer 20 supported to the annular frame 30 through the protective tape 40 as shown in FIG. 8 is placed on the chuck table 36 of the laser beam processing machine 1 shown in FIG. 1. The semiconductor wafer 20 is suction-held on the chuck table 36 through the protective tape 40 by activating a suction means that is not shown (wafer holding step). The annular frame 30 is fixed by the clamps 362. The outer peripheral portion of the semiconductor wafer 20 suction-held on the chuck table 36 may warp in some cases, as shown in FIG. 10.

The chuck table 36 suction-holding the semiconductor wafer 20 as described above is brought to a position right below the image pick-up means 11 by the processing-feed means 37. After the chuck table 36 is positioned right below the image pick-up means 11, alignment work for detecting the area to be processed of the semiconductor wafer 20 is carried out by the image pick-up means 11 and the control means 10. That is, the image pick-up means 11 and the control means 10 carry out image processing such as pattern matching, etc. to align a street 21 formed in a predetermined direction of the semiconductor wafer 20 with the condenser 8 of the laser beam application means 52 for applying a laser beam along the street 21, thereby performing the alignment of a laser beam application position. The alignment of the laser beam application position is also carried out on streets 21 formed on the semiconductor wafer 20 in a direction perpendicular to the above predetermined direction. Although the front surface 20a having the streets 21 of the semiconductor wafer 20 faces down at this point, as the image pick-up means 11 comprises the infrared illuminating means, an optical system for capturing infrared radiation and an image pick-up device (infrared CCD) for outputting an electric signal corresponding to the infrared radiation as described above, an image of the street 21 can be picked up through the rear surface 20b.

Figure 9:
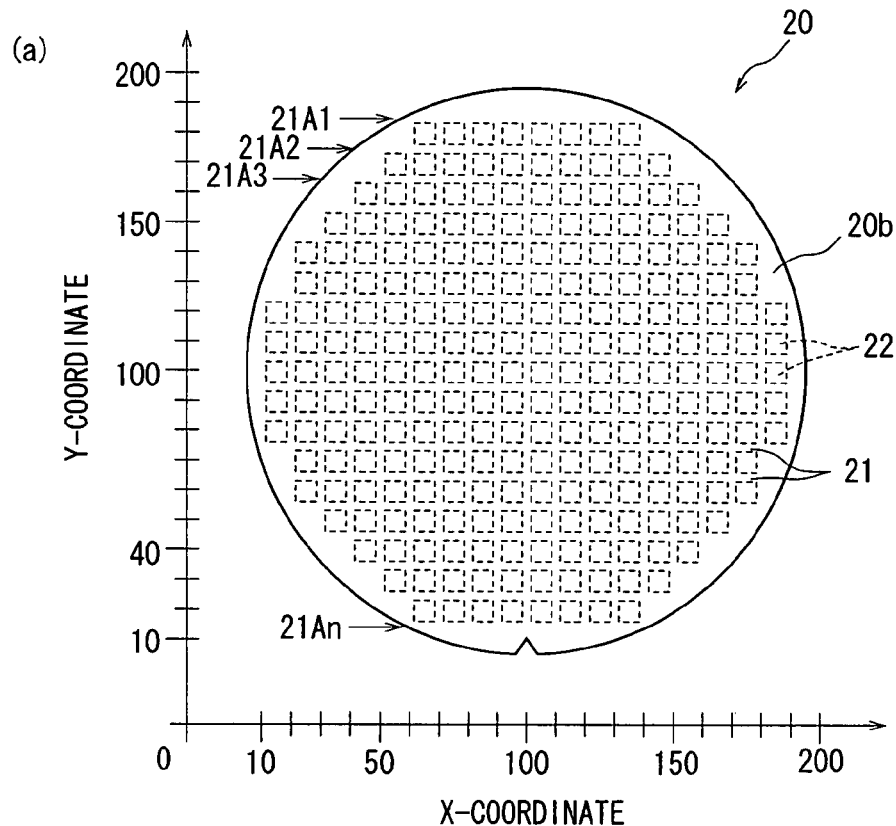
FIGS. 9(a) and 9(b) are explanatory diagrams showing the relationship between the semiconductor wafer shown in FIG. 7 and the coordinate position where the semiconductor wafer is held at a predetermined position of the chuck table of the laser beam processing machine shown in FIG. 1.
Figure 9:
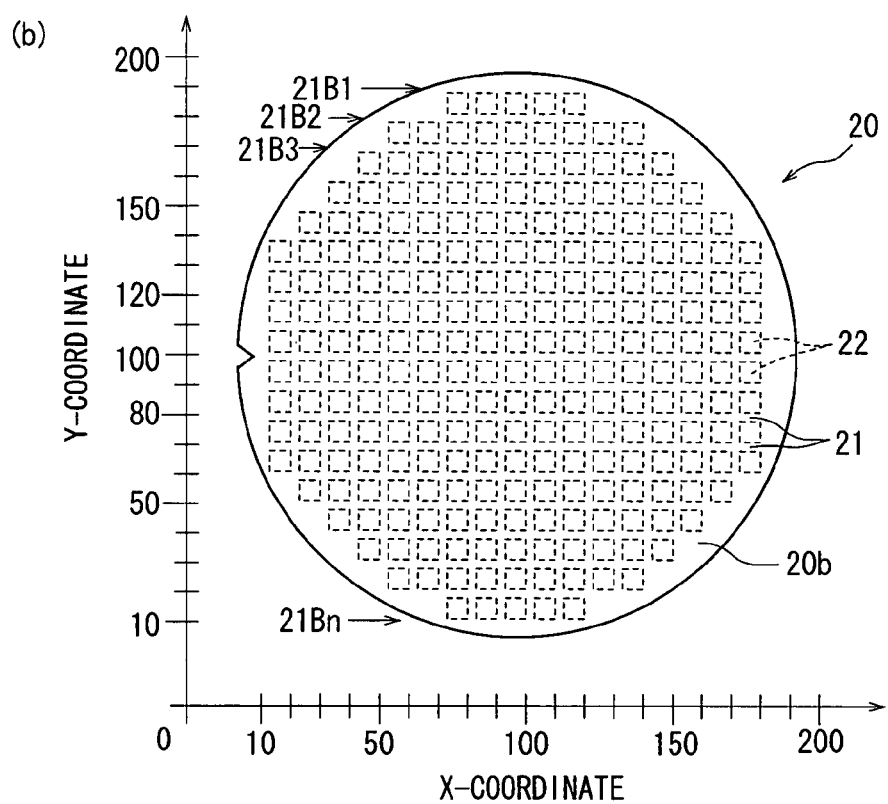

After the above alignment is carried out, the semiconductor wafer 20 suction-held on the chuck table 36 is a state where it is located at the coordinate position shown in FIG. 9(a). FIG. 9(b) shows a state where the chuck table 36, that is, the semiconductor wafer 20 is turned at 90° from the state shown in FIG. 9(a). The design values of the coordinates of the streets (21A1 to 21An, 21B1 to 21Bn) are stored in the read-only memory (ROM) 102 or the random access memory (RAM) 103 of the above control means 10.

After the above alignment, the step of detecting an undulating area occurring in the outer peripheral portion of the semiconductor wafer 20 suction-held on the chuck table 36 is carried out by the above height position detection means 9. That is, the distance from the surface of the workpiece to the focal point Pa of the detection laser beam LB2 can be obtained from the control map shown in FIG. 5 based on the ratio (V1/V2) of the voltage value (V1) output from the first light receiving device 96 to the voltage value (V2) output from the second light receiving device 97 of the height position detection means 9. Therefore, the height position (Z-direction position) of the laser beam application means 52 is first adjusted by activating the focal point positioning means 53 of the laser beam application unit 5 to ensure that the ratio (V1/V2) of the above voltage values of the height position of the center portion of the semiconductor wafer 20 suction-held on the chuck table 36 becomes, for example, "4". Therefore, the distance from the surface of the workpiece to the focal point Pa of the detection laser beam LB2 becomes 20 μm. The chuck table 36 is then moved to bring the outer edge of the semiconductor wafer 20 to a position right below the condenser 8 of the laser beam application means 52, as shown in FIG. 10. The control means 10 obtains the ratio (V1/V2) of the voltage value (V1) output from the first light receiving device 96 to the voltage value (V2) output form the second light receiving device 97 of the height position detection means 9 while the chuck table 36 suction-holding the semiconductor wafer 20 makes one turn in the direction indicated by the arrow 36a. When the largest value of the ratio (V1/V2) of the voltage values is, for example, "10", the control means 10 judges that the outer edge of the semiconductor wafer 20 rises 60 μm from the center portion because the distance from the surface of the workpiece to the focal point Pa of the detection laser beam LB2 is 80 μm from the control map shown in FIG. 5. The chuck table 36 suction-holding the semiconductor wafer 20 is then moved a predetermined distance (for example, 1 mm) in the direction indicated by the arrow X1 and the above ratio (V1/V2) of the voltage values is obtained while the chuck table 36 makes one turn in the direction indicated by the arrow 36a. This work is then carried out sequentially. When the ratio (V1/V2) of the above voltage values becomes, for example "5" (the distance from the surface of the workpiece to the focal point Pa of the detection laser beam LB2 is 30 μm, that is, a 10 μm rise from the center portion of the semiconductor wafer 20) or less, the undulating area detection step is terminated and the undulating area E from the outer edge of the semiconductor wafer 20 is stored in the random access memory (RAM) 103 of the control means 10. And, the control means 10 obtains the coordinate values of the undulating area E and the coordinate values of a stable holding area F other than the undulating area E in the streets (21A1 to 21An, 21B1 to 21Bn) formed on the semiconductor wafer 20 based on this undulating area E and stores these coordinate values in the random access memory (RAM) 103.

After the above undulating area detection step, the control means 10 sets the focal point P of the processing pulse laser beam LB1 to, for example, a position 60 μm away from the rear surface 20b (top surface) of the semiconductor wafer 20 in the stable holding area F other than the undulating area E of the semiconductor wafer 20 and the above voltage value ratio (V1/V2) to "9" in the control map of FIG. 5. The height position (Z-direction position) of the laser beam application means 52 is adjusted by activating the focal point positioning means 53 of the above laser beam application unit 5 to ensure that the above voltage value ratio (V1/V2) becomes, for example, "9".

Figure 11:
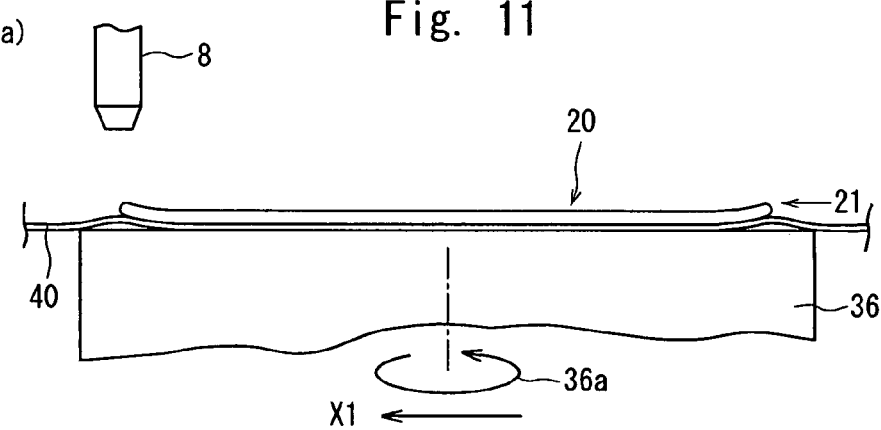
FIGS. 11(a) to 11(d) are explanatory diagrams showing the undulating area deteriorated layer forming step and the stable holding area deteriorated layer forming step in the wafer laser processing method of the present invention.
Figure 11:
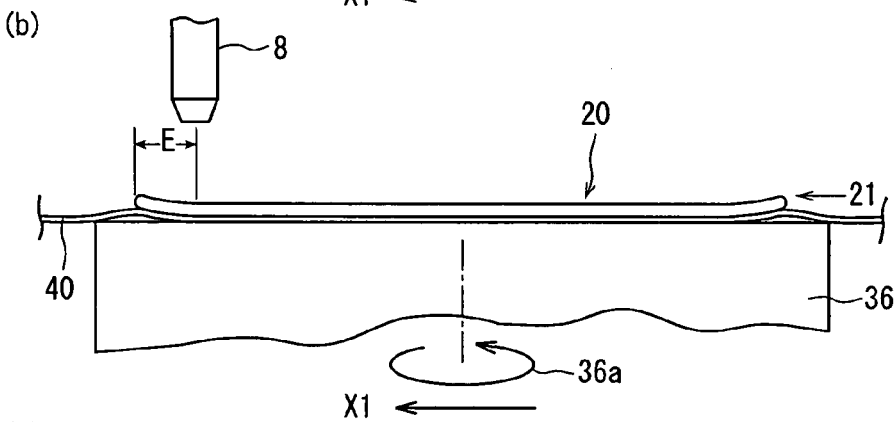
Figure 11:
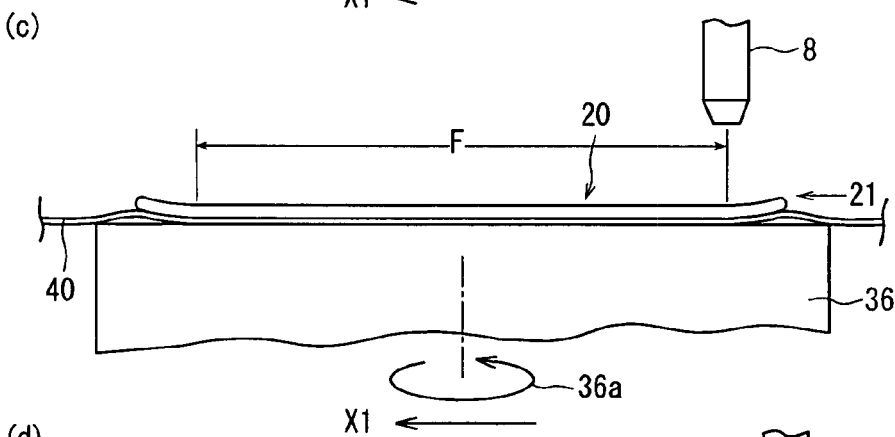
Figure 11:
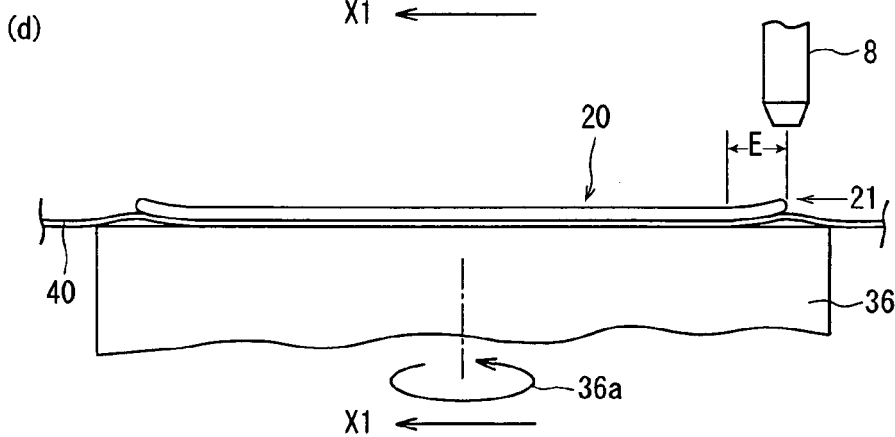

Thereafter, as shown in FIG. 11(a), one end (left end in FIG. 11(a)) of the predetermined street 21 of the semiconductor wafer 20 suction-held on the chuck table 36 is brought to a position right below the condenser 8 of the laser beam application means 52. Then, the control means 10 stops the operation of the focal point position adjustment means 71 and moves the chuck table 36 in the direction indicated by the arrow X1 at a predetermined processing-feed rate while it controls the laser beam application means 52 to apply the processing pulse laser beam LB1 of a wavelength having permeability for a silicon wafer from the condenser 8 (undulating area deteriorated layer forming step). This undulating area deteriorated layer forming step is carried out until the inner end on the right side of the undulating area E is reached as shown in FIG. 11(b). Since the operation of the focal point position adjustment means 71 is stopped and the processing pulse laser beam LB1 is applied in the undulating area deteriorated layer forming step for forming a deteriorated layer in the undulating area E, even if the amount of undulation is large, the control means 10 cannot get out of control and a deteriorated layer 210 can be formed in the inside of the undulating area E on the left side in FIG. 12 of the semiconductor wafer 20, as shown exaggeratedly in FIG. 12.

After the above undulating area deteriorated layer forming step is carried out until the inner end in FIG. 11(b) of the undulating area E is reached, the control means 10 controls the detection laser beam oscillation means 90 to oscillate the detection laser beam LB2 and activates the focal point position adjustment means 71 to continue the application of the processing pulse laser beam LB1 of a wavelength having permeability for a silicon wafer (stable holding area deteriorated layer forming step). And, this stable holding area deteriorated layer forming step is carried out until the inner end on the left side in FIG. 11(c) of the undulating area E is reached as shown in FIG. 11(c). Therefore, in the stable holding area F other than the undulating area E, the height position of the rear surface 20b (top surface) of the semiconductor wafer 20 is detected by the height position detection means 9, the voltage value (V1) output from the above first light receiving device 96 and the voltage value (V2) output from the second light receiving device 97 are supplied to the control means 10. The control means calculates the voltage value ratio (V1/V2) based on the voltage value (V1) output from the first light receiving device 96 and the voltage value (V2) output from the second light receiving device 97 and controls the angle adjusting actuator 713c of the first galvanoscanner 713 and the angle adjusting actuator 714c of the second galvanoscanner 714 constituting the above focal point position adjustment means 71 to ensure that the voltage value ratio (V1/V2) becomes "9" if not. As a result, a deteriorated layer 220 is formed parallel to the rear surface 20b (top surface) at a position 60 μm from the rear surface 20b (top surface) in the inside of the semiconductor wafer 20 as shown in FIG. 12.

After the above stable holding area deteriorated layer forming step is carried out until the inner end in FIG. 11(c) of the undulating area E is reached, the control means 10 stops the operation of the focal point position adjustment means 71 and continues the application of the processing pulse laser beam LB1 of a wavelength having permeability for a silicon wafer (undulating area deteriorated layer forming step). When the application position of the condenser 8 reaches the other end (right end in FIG. 11(d)) of the street 21 as shown in FIG. 11(d), the application of the processing pulse laser beam LB1 is suspended and the movement of the chuck table 36 is stopped. As a result, the deteriorated layer 210 is formed in the inside of the undulating area E on the right side in FIG. 12 of the semiconductor wafer 20 as shown in FIG. 12.

Figure 12:
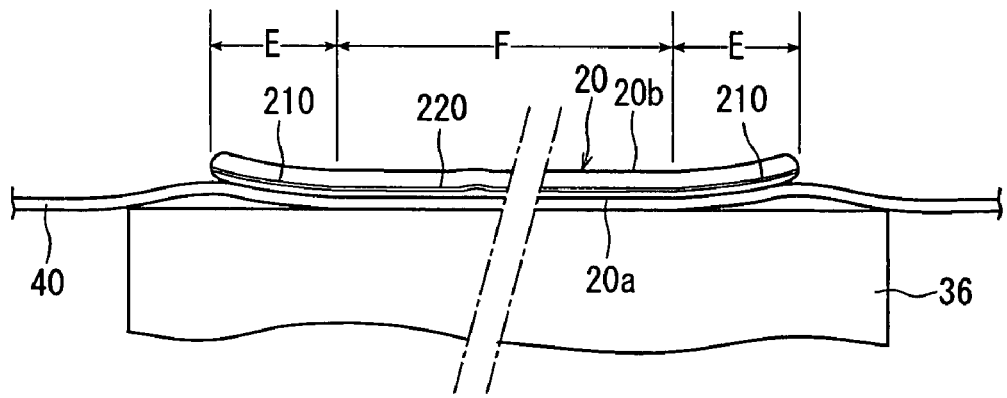
FIG. 12 is an explanatory diagram showing that deteriorated layers are formed in the inside of the wafer by the undulating area deteriorated layer forming step and the stable holding area deteriorated layer forming step in the wafer laser processing method of the present invention.

When the undulating area deteriorated layer forming step, the stable holding area deteriorated layer forming step and the undulating area deteriorated layer forming step are carried out as described above, the deteriorated layers 210 and 220 are formed at a predetermined depth position in the undulating area E and the stable holding area F along the street 21 as shown in FIG. 12 in the inside of the semiconductor wafer 20.

The processing conditions in the above undulating area deteriorated layer forming step and the stable holding area deteriorated layer forming step are set as follows, for example.

Figure 13:
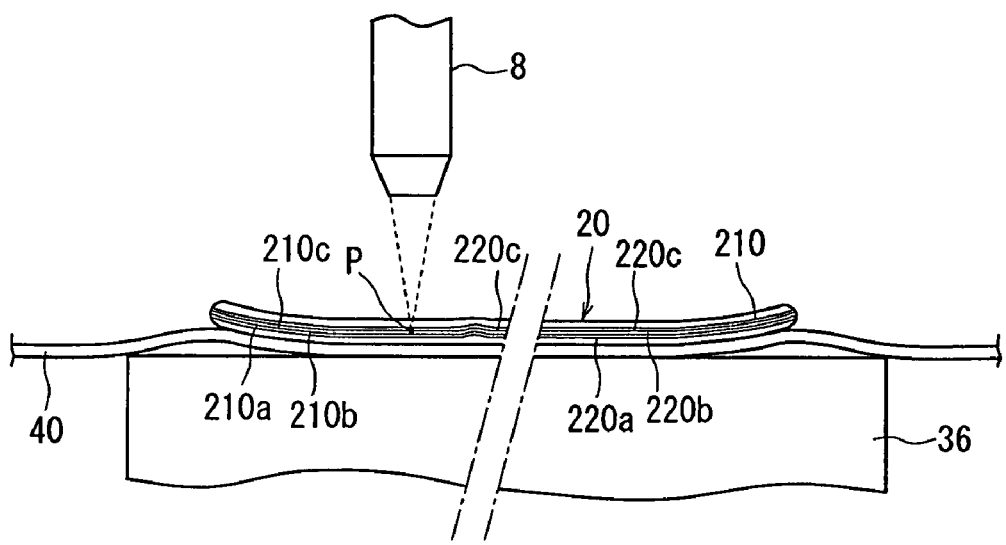
FIG. 13 is an explanatory diagram showing the undulating area deteriorated layer forming step and the stable holding area deteriorated layer forming step when the semiconductor wafer as the workpiece is thick.

Processing laser: YVO4 pulse laser
Wavelength: 1,064 nm
Repetition frequency: 100 kHz
Diameter of focal spot: 1 μm
Processing-feed rate: 100 mm/sec Under the above processing conditions, the deteriorated layers 210 and 220 having a thickness of about 20 μm can be formed. When the semiconductor wafer 20 is thick, as shown in FIG. 13, a plurality of deteriorated layers 210a, 210b and 210c and a plurality of deteriorated layers 220a, 220b and 220c can be formed by changing the above voltage value ratio (V1/V2) to "7" and "5" stepwise so as to position the focal point P 20 μm above its previous position and carrying out the above processing step several times.

After the above undulating area deteriorated layer forming step, the stable holding area deteriorated layer forming step and the undulating area deteriorated layer forming step are carried out along all the streets 21 extending in the predetermined direction of the semiconductor wafer 20 as described above, the chuck table 36 is turned at 90° to carry out the above undulating area deteriorated layer forming step, the stable holding area deteriorated layer forming step and the undulating area deteriorated layer forming step along streets 21 extending in a direction perpendicular to the above predetermined direction. After the above the above undulating area deteriorated layer forming step, the stable holding area deteriorated layer forming step and the undulating area deteriorated layer forming step are carried out along all the streets 21 formed on the semiconductor wafer 20, the chuck table 36 holding the semiconductor wafer 20 is returned to a position where it first suction-held the semiconductor wafer 20 to cancel the suction-holding of the semiconductor wafer 20. The semiconductor wafer 20 is carried to the dividing step by a conveying means that is not shown.

Since the processing pulse laser beam LB1 is applied to the undulating area E of the semiconductor wafer 20 suction-held on the chuck table 36 without activating the focal point position adjustment means 71 in the wafer laser processing method of the present invention, even if the amount of undulation is large, the control means 10 cannot get out of control and the desired deteriorated layer 210 can be formed in the inside of the semiconductor wafer 20. Since the processing pulse laser beam LB1 is applied to the stable holding area F by activating the focal point position adjustment means 71 while the focal point P of the processing pulse laser beam LB1 is adjusted in accordance with the height position of the semiconductor wafer 20, laser processing can be carried out at a position parallel to the processing surface (rear surface 20b) of the semiconductor wafer 20.

What is claimed is:

1. A wafer laser processing method for forming a deteriorated layer in the inside of a wafer having streets formed in a lattice pattern on the front surface along the streets by using a laser beam processing machine comprising a chuck table having a holding surface for suction-holding the wafer, a laser beam application means having a condenser for applying a laser beam to the wafer suction-held on the holding surface of the chuck table, a focal point positioning means for moving the condenser of the laser beam application means in a direction perpendicular to the holding surface, a focal point position adjustment means for shifting the position of the focal point of a laser beam applied from the condenser of the laser beam application means, a height position detection means for detecting the height position of the top surface of the wafer held on the chuck table, and a control means for controlling the focal point position adjustment means based on a detection signal from the height position detection means, the method comprising:

a wafer holding step for suction-holding the wafer on the chuck table in such a manner that the processing surface of the wafer faces up;

an undulating area detection step for detecting an undulating area in the outer peripheral portion of the wafer suction-held on the chuck table by means of the height position detection means;

an undulating area deteriorated layer forming step for activating the focal point positioning means to position the focal point of the laser beam applied from the condenser of the laser beam application means to a preset position and applying a laser beam along the streets to the undulating area of the wafer suction-held on the chuck table without activating the focal point position adjustment means to form a deteriorated layer along the streets in the inside of the undulating area of the wafer; and a stable holding area deteriorated layer forming step for applying a laser beam along the streets to a stable holding area other than the undulating area of the wafer suction-held on the chuck table while the focal point position adjustment means is controlled based on a detection signal from the height position detection means to form a deteriorated layer along the streets in the inside of the stable holding area of the wafer.

2. The wafer laser processing method according to claim 1, wherein the undulating area detection step is carried out while the chuck table suction-holding the wafer is turned.

* * * * *